(12) United States Patent
Ammar et al.

(10) Patent No.: US 6,714,089 B2
(45) Date of Patent: Mar. 30, 2004

(54) HIGH FREQUENCY SIGNAL SOURCE AND METHOD OF GENERATING SAME USING DIELECTRIC RESONATOR OSCILLATOR (DRO) CIRCUIT

(75) Inventors: Danny F. Ammar, Windermere, FL (US); Conrad Jordan, Tampa, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 10/266,938

(22) Filed: Oct. 8, 2002

(65) Prior Publication Data

US 2003/0222725 A1 Dec. 4, 2003

Related U.S. Application Data

(60) Provisional application No. 60/383,959, filed on May 29, 2002.

(51) Int. Cl.$^7$ ............................................. H03B 11/10
(52) U.S. Cl. ..................... 331/107 DP; 331/96; 331/99; 331/2; 455/260
(58) Field of Search ........................... 331/107 DP, 17, 331/2, 96, 99; 375/376; 455/111, 113, 260, 255, 258

(56) References Cited

U.S. PATENT DOCUMENTS

| | | | |
|---|---|---|---|
| 4,712,078 A | 12/1987 | Slobodnik, Jr. et al. | 331/99 |
| 4,763,084 A | 8/1988 | Pavio, Jr. et al. | 331/56 |
| 4,835,498 A | 5/1989 | Rouger et al. | 333/205 |
| 4,887,052 A | 12/1989 | Murakami et al. | 331/96 |
| 5,233,319 A | 8/1993 | Mizan et al. | 333/219.1 |
| 5,414,741 A | 5/1995 | Johnson | 375/376 |
| 5,768,693 A | * 6/1998 | Wong | 455/116 |
| 5,818,305 A | 10/1998 | Jeon | 331/47 |
| 5,834,981 A | 11/1998 | Trier et al. | 331/99 |
| 5,940,457 A | * 8/1999 | Dreifuss et al. | 375/376 |
| 6,011,446 A | 1/2000 | Woods | 331/185 |
| 6,150,890 A | 11/2000 | Damgaard et al. | 331/14 |
| 6,161,003 A | 12/2000 | Lo Curto et al. | 455/260 |
| 6,188,296 B1 | 2/2001 | Nibe et al. | 331/117 D |
| 6,362,708 B1 | 3/2002 | Woods | 333/234 |
| 6,384,691 B1 | 5/2002 | Sokolov | 331/76 |
| 2002/0097100 A1 | 7/2002 | Woods et al. | 331/99 |

OTHER PUBLICATIONS

Patent Abstracts of Japan, vol. 1998, No. 13, Nov. 30, 1998, and JP 10 224217, Aug. 21, 1998.
Patent Abstracts of Japan, vol. 007 No. 204, Sep. 9, 1983, and JP 58 101531, Jun. 16, 1983.
Borst, K. et al.; "Low Noise Synthesized Microwave Local Oscillator for High Capacity Digital Radio Systems Using a Dielectric Resonator and a Saw Reference," Proceedings of the European Microwave Conference, Sep. 1989, pp. 555–560.
Khanna, A.P.S. et al.; "A Highly–Stable 36 Ghz GaAs FET DRO With Phase–Lock Capability," Microwave Journal, vol. 32, No. 7, Jul. 1, 1989, pp. 117–118, 120, 122.
Ishii, K. et al.; "An On–Board 47–GHz Phase–Locked Oscillator Using FET Gate Bias Control for Low Phase Noise," Proceedings of the 23rd European Microwave Conference, Sep. 1993, pp. 767–769.
Brumbi, D.; "Low Power FMCW Radar System for Level Gaging," Microwave Symposium Digest, 2000 IEEE MTT–S International, Jun. 2000, pp. 1559–1562.

* cited by examiner

*Primary Examiner*—Arnold Kinkead
(74) *Attorney, Agent, or Firm*—Allen, Dyer, Doppelt, Milbrath & Gilchrist, P.A.

(57) ABSTRACT

A high frequency signal source and method of generating a high frequency signal is disclosed. An output signal is generated from a dielectric resonator oscillator and mixed with an output signal from a voltage controlled oscillator having a predetermined tuning range and part of a phase locked loop circuit to sum the frequencies for creating a final output frequency. A portion of the final output frequency is coupled into the phase locked loop circuit that is phase locked to a reference signal from a crystal reference oscillator. The voltage controlled oscillator has a tuning range that is used to compensate for the dielectric resonator oscillator initial frequency error and drift over temperature and aging while the balance of the bandwidth is used to provide the tuning range on the local oscillator output. The phase locked loop circuit is phase locked to the reference crystal oscillator that is used to compensate for any initial dielectric resonator oscillator frequency errors because of manufacturing and for any drift because the temperature changes or aging.

21 Claims, 4 Drawing Sheets

HIGH FREQUENCY SIGNAL SOURCE AND METHOD OF GENERATING SAME USING DIELECTRIC RESONATOR OSCILLATOR (DRO) CIRCUIT

RELATED APPLICATION

This application is based upon prior filed copending provisional application Ser. No. 60/383,959 filed May 29, 2002.

FIELD OF THE INVENTION

This invention relates to communication systems, and more particularly, this invention relates to high frequency signal sources using dielectric resonator oscillators (DRO's) used for producing a local oscillator signal.

BACKGROUND OF THE INVENTION

In communication circuits, the Local Oscillator (LO) signal must exhibit low phase noise, corresponding to the random phase instability of a signal, to meet the signal requirements of the digital modulation scheme used in a communications system. The signal also must maintain acceptable bit error rate (BER) requirements. Any circuit that generates the local oscillator signal should have a wide tuning range for multiple channel selection, and a minimal frequency drift over temperature to maintain the transceiver locked into a selected channel. It should provide enough power to drive directly a mixer for up or down frequency conversion as required in modern, high frequency communications systems.

Free running Dielectric Resonator Oscillators (DRO) are attractive, high frequency microwave sources because of their high Q, low phase noise, good output power and a relatively high stability of operation versus temperature. These type of oscillators represent a good compromise of cost, size, and performance compared to alternative prior art signal sources, such as cavity oscillators or multiplied crystal oscillators. Dielectric resonator oscillators, however, do not have any controllable tuning range, and they exhibit frequency drift versus temperature and aging. Also, these devices have always required manual tuning to achieve the desired frequency accuracy.

Voltage controlled Dielectric Resonator Oscillators (DRO) are similar devices that are also attractive microwave sources because of their high Q, low phase noise, good output power and high stability versus temperature. These devices also represent a fair compromise of cost, size, and performance compared to cavity oscillators and multiplied crystal oscillators. Drawbacks of voltage controlled dielectric resonator oscillators are limited electronic tuning range and have a reduced Q because of varactor pulling. They also exhibit frequency drift versus temperature and aging. As a result, these dielectric resonator oscillators have always required manual tuning to achieve the desired frequency accuracy.

SUMMARY OF THE INVENTION

It is therefore an object of the present invention to provide a high frequency signal source and method using a Dielectric Resonator Oscillator (DRO) circuit that overcomes the disadvantages of the prior art described above.

It is another object of the present invention to provide a high frequency signal source using a digitally compensated, frequency accurate, free running dielectric resonator oscillator circuit that overcomes the disadvantages of the prior art.

The present invention provides a novel and unobvious signal source using a digitally compensated, frequency accurate, free running dielectric resonator oscillator that resolves the shortcomings of traditional free running dielectric resonator oscillators. The circuit of the present invention provides a wide frequency tuning range, requires no manual tuning, and eliminates frequency drift over temperature and aging. The present invention can be used for generating a low cost, stable, and high frequency local oscillator source for terrestrial and satellite communications.

The high frequency signal source of the present invention generates a high frequency local oscillator signal using a free running dielectric resonator oscillator, which is compensated by a Phase Locked Loop (PLL), Voltage Controlled Oscillator (VCO), thus, eliminating the requirement for manual tuning of the dielectric resonator oscillator. The circuit of the present invention automatically compensates for dielectric resonator oscillator frequency drift over temperature and aging, and achieves a wide frequency tuning range without compromising phase noise performance. It eliminates manufacturing complexity, tuning and the costs associated with a voltage controlled dielectric resonant oscillator currently used by many skilled in the art. It also self-compensates for frequency drift caused by mechanical or printed circuit board (PCB) variation over temperature.

In accordance with the present invention, the high frequency signal source includes a dielectric resonator oscillator having an output signal. A mixer receives the output signal from the dielectric resonator oscillator. A phase locked loop circuit has a voltage controlled oscillator with a predetermined tuning range operatively connected to the mixer such that the mixer receives an output frequency from a voltage controlled oscillator and sums the output frequencies for creating a summed output frequency. A portion of the summed output frequency is fed as a coupled signal into the phase locked loop circuit that is phase locked to a reference signal, wherein a higher output frequency accuracy with low phase noise is achieved without manual tuning and a portion of the tuning range of the voltage controlled oscillator compensates for any dielectric resonator oscillator initial frequency error and drift over temperature and aging.

In yet another aspect of the present invention, a crystal reference oscillator is operatively connected to the phase locked loop circuit and provides a stable reference signal thereto. A filter is operatively connected to the mixer and filters the summed output frequency and eliminates unused side bands. The filter includes a high side filter that filters the upper side band of the summed output frequency and provides a final output frequency. A low side filter is operatively connected to the phase locked loop circuit and filters the lower side band of the summed output frequency and provides a coupled signal to the phase locked loop circuit.

An amplifier is operatively connected to the mixer and amplifies the summed output frequency. A divider circuit can be positioned within the phase locked loop circuit and divide the coupled signal by a factor "N", respectively. A phase locked loop chip can have registers that are programmed for dividing the coupled signal and reference signal by a divide ratio "M" and "N". A microcontroller is connected to the phase locked loop chip and can program the divide ratio between "M" and "N".

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
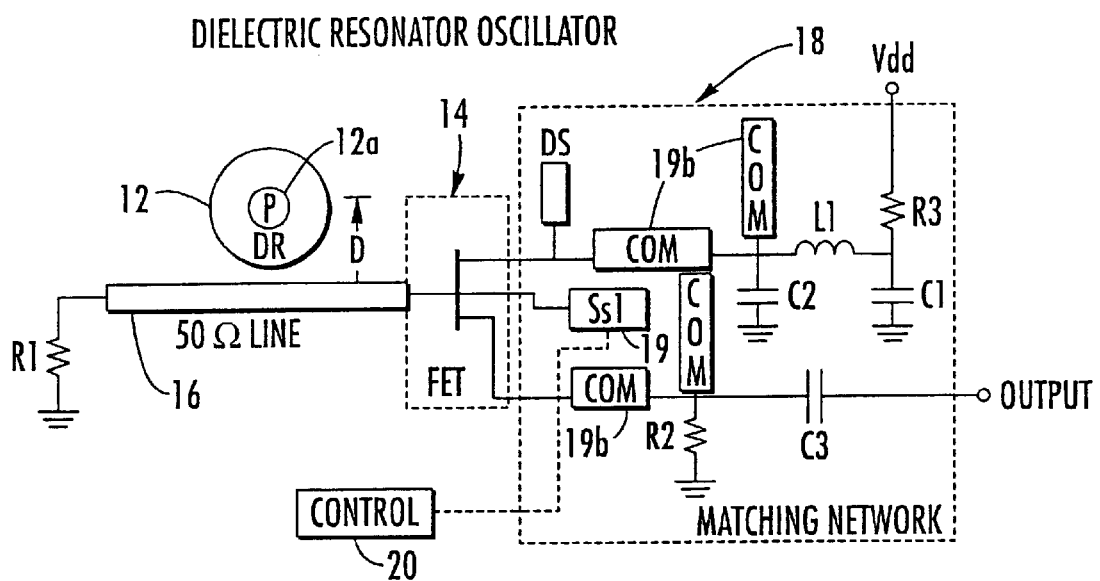
FIG. 1 is a partial, schematic circuit diagram of a prior art, free running dielectric resonator oscillator.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention provides a novel and unobvious high frequency signal source using a digitally compensated, frequency accurate, free running dielectric resonator oscillator that resolves the shortcomings of traditional free running dielectric resonator oscillators. The circuit of the present invention provides a wide frequency tuning range, requires no manual tuning, and eliminates frequency drift over temperature and aging. The present invention can be used for generating a low cost, stable, and high frequency local oscillator source for terrestrial and satellite communications.

The high frequency signal source of the present invention generates a high frequency local oscillator signal using a free running dielectric resonator oscillator, which is compensated by a Phase Locked Loop (PLL), Voltage Controlled Oscillator (VCO), thus, eliminating the requirement for manual tuning of the dielectric resonator oscillator. The circuit automatically compensates for dielectric resonator oscillator frequency drift over temperature and aging, and achieves a wide frequency tuning range without compromising phase noise performance. It eliminates manufacturing complexity, tuning and cost of a voltage controlled, dielectric resonant oscillator currently as used by many skilled in the art. It also self-compensates for frequency drift caused by mechanical or printed circuit board (PCB) variation over temperature.

For purposes of background, a brief explanation of a common dielectric resonator oscillator will be explained, followed by a more detailed description of the present invention.

As known to those skilled in the art, there are essentially four different classes of free running dielectric resonator oscillators that are used by circuit designers for high frequency signal sources and associated circuits. These oscillators include reaction, transmission, parallel feedback and reflection dielectric resonator oscillators. The reflection dielectric resonator oscillator is the most commonly used in communication systems. This type of dielectric resonator oscillator uses a negative resistance in which the dielectric resonator is placed near a terminated microstrip line that is connected to the input of an unstable amplifier, such as a field effect transistor (FET). Near its resonant frequency, the dielectric resonator reflects power back to the amplifier, causing an oscillation build-up between the two components that is tapped.

As known to those skilled in the art, dielectric resonator oscillators that are stabilized have become very practical and useful devices ever since the development of high dielectric constant, high Q, low loss temperature compensated ceramic materials. Usually, the dielectric resonator oscillator includes a dielectric resonator having a "puck" or other resonant element as known to those skilled in the art. A field effect transistor (FET) is coupled to an impedance matching network. The resonant structure or "puck" is contained in a resonator cavity, which could be formed by different structures, such as a metallic cylinder, and positioned near one or more microstrips. The "puck" is sometimes positioned on a base and, in many prior art examples, the structures include manual tuning screws that are mounted for selective movement into a cavity such that the "puck," a resonant "disk" or other resonant element is positioned a fractional or other wavelength distance away from one or more microstrip lines and at an appropriate height thereto.

FIG. 1 shows a prior art reflection dielectric resonator oscillator circuit 10. Two major elements in this circuit 10 are the dielectric resonator 12 and the field effect transistor (FET) amplifier 14. The dielectric resonator 12, which is made of high Q material, defines the Q of the circuit and locks the frequency. At present, commercially available dielectric resonators exhibit $Q_o$ as high as 10,000 at 10 GHz, and a dielectric constant between 34 and 40. As for the amplifier, GaAs field effect transistors have ben found to be suitable amplifiers for high frequency dielectric resonator oscillator circuits because they naturally exhibit a very high $F_t$, a good loop gain and enough output power in the Ku-band and up to 25 GHz.

FIG. 1 illustrates that the dielectric resonator 12 contains the puck 12a or other resonant element and is positioned a distance "d" from a desired 50 ohm microstrip transmission line 16 that is terminated with a resistor R1 to ground. The field effect transistor 14 includes the normal source (S), drain (D) and gate (G) that are connected to the impedance matching network 18. The gate (G) is controlled by a select signal line SS1 19 or other control line that is operative with a microcontroller or other circuit controller 20. A drain-source connection pad (DS) 19a is operatively connected to the field effect transistor 14, together with appropriate other components, including various resistors R2 and R3 and capacitors C1 and C2 that are in a "pie" Π configuration with a coil inductor L1. Capacitor C3 is operatively connected to the dielectric resonator oscillator output and provides filtering for the signal. Resistor R3 is connected to the supply voltage of the drain Vdd as indicated in FIG. 1. Other matching network components 19b as indicated by rectangular blocks are included as chosen by those skilled in the art.

The position of the dielectric resonator 12 relative to the transmission line 16 determines the stability, output power and phase noise of the overall oscillator. Adjusting the distance "d" in FIG. 1 increases or decreases the amount of coupling. A higher coupling provides more output power and robustness of oscillation build-up. This higher coupling, however, reduces the load Q and therefore, the phase noise performance. A lower coupling will improve phase noise, but it reduces the output power and may cause the dielectric resonator oscillator to fail to oscillate. The phase relationship of the resonator element ("puck") 12a to the active devices, such as the field effect transistor 14 and/or other components, is equally critical to create an oscillation build-up in an efficient manner. The electrical length (θ), representing the physical distance between the field effect transistor 14 and the plane of reference for the puck 12a determines how fast and stable the build-up will occur, driving both output power and phase noise performance.

In traditional dielectric resonator oscillator circuits, the electrical layout is only one aspect of the oscillator design. Mechanical aspects also influence the performance of this local oscillator. The size and height of the cavity used for containing the puck 12a have loading effects on the local oscillator, which can reduce the phase noise performance and create unwanted frequency drift over temperature. As a rule of thumb, the cavity should be at least three pucks high and three pucks wide, in order to have reasonable thermal and loading effects. The height requirement is one of the reasons that circuit designers prefer to position a dielectric resonator on a "stand-off" to aid in ensuring that the housing and the printed circuit board on which the dielectric resonator usually rests does not adversely affect the performance of the resonator.

The lack of mechanical integrity for the material of the printed circuit board also causes local oscillators to drift over temperature and create long-term aging effects, especially if the cavity is resting on the printed circuit board. Although the printed circuit board material, such as the Rogers 4003 Board by Rogers Corporation, as known to those skilled in the art, is hard enough to allow only minimum variations, frequency drift due to aging still occurs. In most of these prior art circuits, the fine-tuning and adjustment of the dielectric resonator oscillator is set by manually turning a tuning screw to increase the dielectric resonator resonant frequency as it closes the electrical field above the puck. This provides as much as 60 MHz of tuning range. Tuning this frequency with a tuning screw, however, is achieved at the expense of reduction in both unloaded Q and temperature stability.

Figure 2:
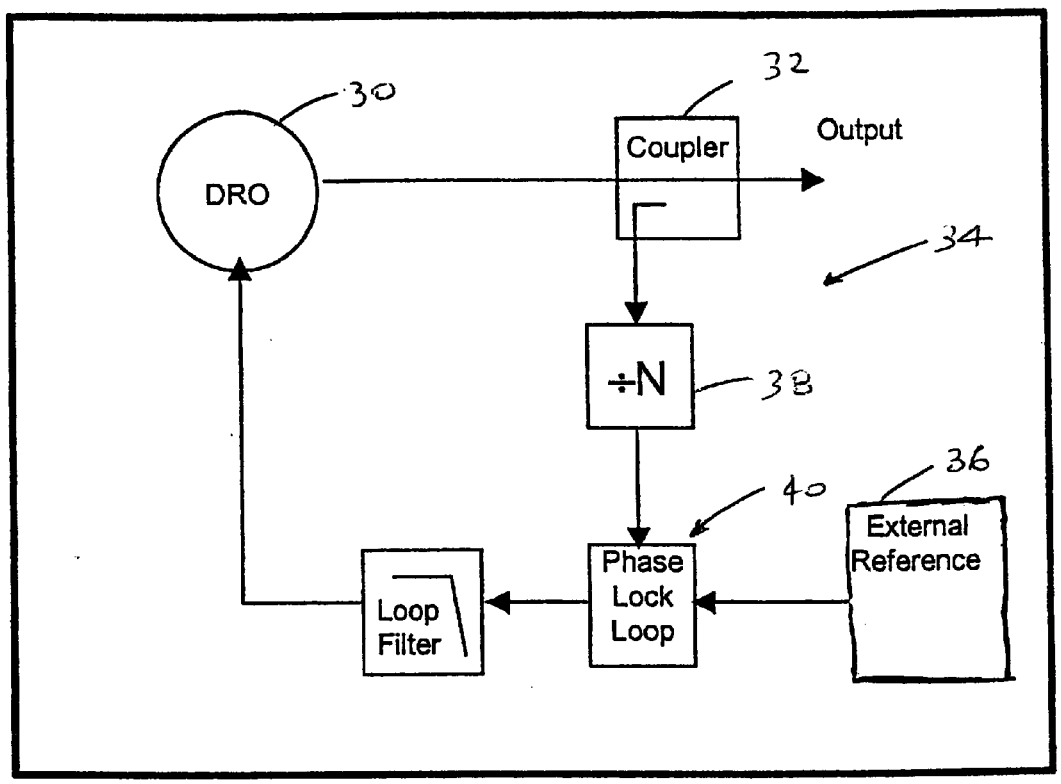
FIG. 2 is a block diagram of a phased locked loop dielectric resonator oscillator frequency synthesizer that generates a high frequency signal.

Some prior art dielectric resonator oscillator circuit designs, on the other hand, have locked the frequency to a reference signal using a phase locked loop circuit. As illustrated in FIG. 2, an example of a dielectric resonator oscillator circuit 30 is operatively connected to a coupler 32 at its output. A portion of the output signal from the dielectric resonator oscillator 30 is coupled into a phase locked loop circuit 34, which receives an external reference signal, such as from a crystal oscillator 36. The coupled output signal is typically divided down within divider circuit 38 before passing into a phase locked loop chip 40 that may include other divide circuits and a phase detector, as known to those skilled in the art. Any programmable divider circuits in the phase locked loop circuit can be used in a feedback loop to divide the coupled output signal by a factor "N" and also divide any reference signal generated by the crystal oscillator 36 by a factor "M," such that outputs are equal to a common phase comparison frequency using techniques known to those skilled in the art.

In this typical phase locked loop dielectric resonator oscillator circuit of FIG. 2, the dielectric resonator oscillator 30 is phase locked to a reference crystal oscillator 36 to control the frequency drift. Although this design addresses some of the frequency drift issues, it does not adequately address the need for manual tuning of the dielectric resonator oscillator 30 during manufacture to set it to the desired frequency. It also has a limited tuning range, typically about 10 MHz.

It is evident that the more traditional dielectric resonator oscillator designs suffer from the following shortcomings:

1. Frequency drift versus temperature and aging;
2. Frequency drift caused by printed circuit board and mechanical variations versus temperature;
3. Manual tuning and adjustments as required to set the dielectric resonator resonant frequency at the desired output;
4. Reduced temperature stability caused by frequency tuning with a tuning screw;
5. Manual tuning of the puck position to achieve optimum performance;
6. Manual tuning of the field effect transistor amplifier to achieve high output power; and
7. A very limited electronic tuning range.

The present invention provides a unique circuit structure and method of designing and building a high frequency signal source that uses frequency accurate, free running dielectric resonator oscillator. The present invention generates a high frequency local oscillator signal while resolving all the shortcomings of traditional dielectric resonator oscillators. The design provides a wide frequency tuning range, requires no manual tuning, and eliminates frequency drift over temperature and aging.

Figure 3:
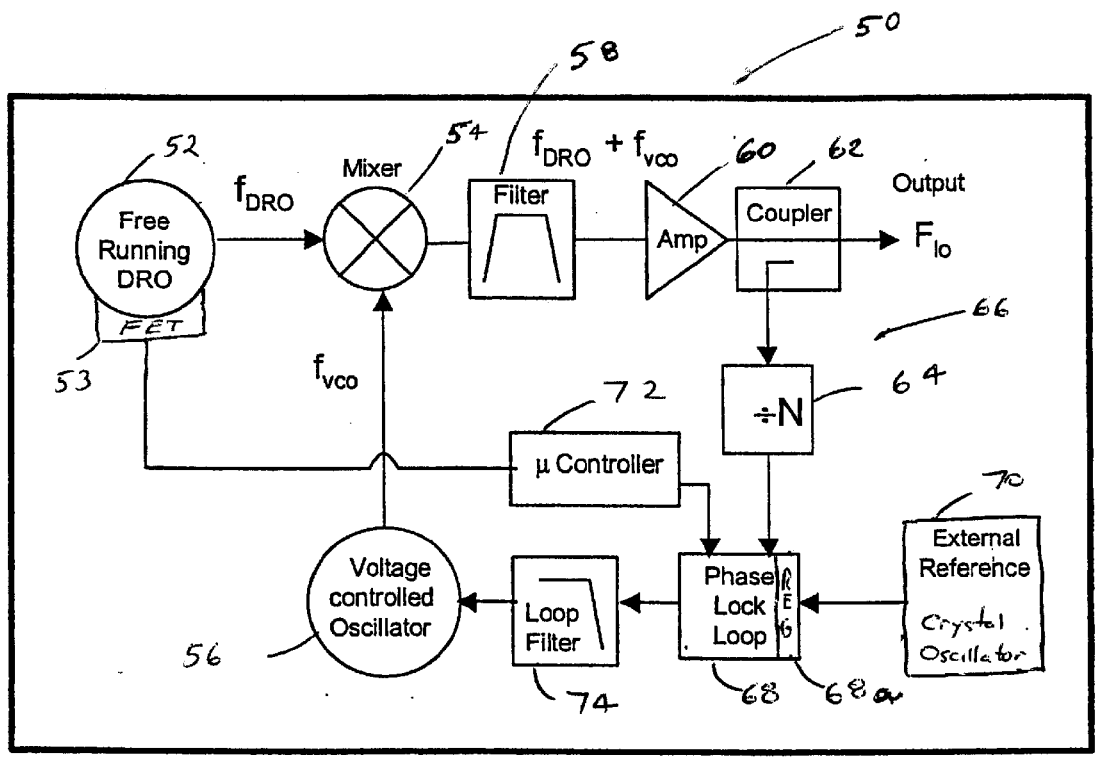
FIG. 3 is a block diagram of a high frequency signal source of the present invention using a self-tuned dielectric resonator oscillator frequency synthesizer.

FIG. 3 is a block diagram showing major circuit components of the present invention and showing a high frequency signal source 50 that uses frequency accurate dielectric resonator oscillator. The signal source 50 of the present invention requires no manual tuning of the dielectric resonator oscillator 52, yet achieves a high output frequency accuracy, low phase noise, and no drift over temperature.

As illustrated, a free running dielectric resonator oscillator 52 is formed as a structure known to those skilled in the art, and includes a field effect transistor 53, and any matching networks as may be necessary. The oscillator 52 outputs a signal at a frequency $F_{DRO}$ into a mixer 54 that also receives an output signal generated from a voltage controlled oscillator 56 as indicated by the signal $F_{FCO}$. The mixer 54 outputs a summed frequency $F_{DRO}+F_{VCO}$ through a bandpass filter 58 and into an amplifier 60, where the frequency is amplified and output as a final local oscillator high frequency signal $F_{LO}$.

A portion of the final frequency signal used for the local oscillator signal is coupled 62 from a coupler into a divider circuit 64 that is part of a phase locked loop circuit 66, including a phase locked loop chip 68 that receives an external reference signal from a crystal reference oscillator 70. The phase locked loop chip 68 can include internal divide circuits that are separate from the divider circuit 64 and can be formed by chip registers 68a contained in the phase locked loop chip 68 and controlled by a microcontroller 72.

The divide circuits in chip 68 can also divide the reference signal by a factor "M." It is, thus, possible to establish a ratio between "N" and "M" such that various output signals can be made equal to desired multiples of the reference frequency supplied by the external crystal reference 70. The output from the phase locked loop chip 68 passes through a loop filter 74, which typically is a low-pass filter that passes signals only below an established cut-off frequency for the phase locked loop circuit 66. An error signal is typically a varying DC level signal that is used to control the frequency of the voltage controlled oscillator.

The phase detector as part of the phase locked loop chip includes the two input signals as the external reference signal from the crystal reference 70 and the output from the coupler that is "divided-down." The circuit design, as shown in FIG. 3, allows the high frequency signal source 50 using the frequency accurate dielectric resonator oscillator to require no manual tuning and achieve a high output frequency accuracy, low phase noise and no drift over temperature.

As an example, if the desired local oscillator frequency is 9.5 GHz, the free running dielectric resonator oscillator 52 is used to generate about 8 GHz, and the remaining 1.5 GHz is provided by the voltage controlled oscillator 56. A low cost voltage controlled oscillator, running at 1.5 GHz provides up to 150 MHz tuning range. A portion of this tuning range is used to compensate for the dielectric resonator oscillator initial frequency error and drift over temperature and aging, and the rest is used to provide some tuning range on the local oscillator output.

The phase locked loop circuit 66 is phase locked to the reference crystal oscillator 70 and used to compensate for any initial dielectric resonator oscillator frequency errors due to manufacturing and for any drift due to temperature changes or aging. The major phase locked loop circuit function is usually available on a single chip, as noted before, with any necessary phase detector function and signal divider/multiplier functions incorporated therein. The output of the dielectric resonator oscillator 52 is mixed with the voltage controlled oscillator 56 output signal to create the desired summed output frequency. The output of the mixer is filtered to eliminate the unused lower or upper side bands. The signal is amplified and ready to be used as an local oscillator source signal.

Part of the summed frequency is coupled from the coupler 62 as a coupled signal to operate the phase locked loop circuit. The coupled signal is divided down in frequency by a factor of 4 to 8 to generate a lower frequency. The phase locked loop chip 68 can further divide the coupled output by a factor "N" to make the divided output equal to the reference clock frequency. As noted before, the phase locked loop chip 68 also has the ability to divide the reference frequency clock signal generated by the crystal reference oscillator 70 by a factor "M" to align the divided local oscillator frequency with the reference signal frequency. The microcontroller 72 programs the phase locked loop chip registers 68a with the desired divide ratios ("M" and "N").

The microcontroller 72 also optimizes the dielectric resonator oscillator output signal by adjusting the field effect transistor gate bias. The crystal oscillator frequency is usually between 10 to 100 MHz. The choice of the crystal is critical because the frequency source output phase noise and spur level is a direct multiplication of the reference frequency source phase noise and spur level. The loop filter bandwidth is typically between 1 and 3 KHz.

Figure 4:
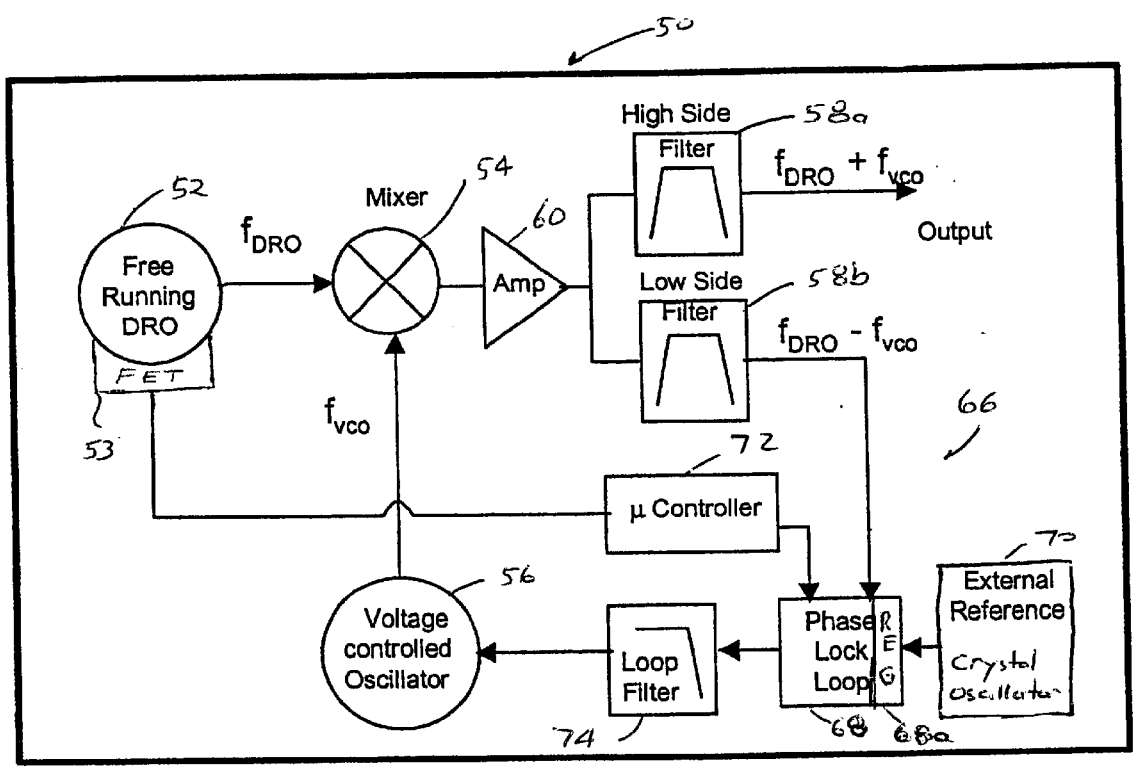
FIG. 4 is a block diagram of another embodiment of the high frequency signal source of the present invention using a self-tuned dielectric resonator oscillator frequency synthesizer.

FIG. 4 illustrates another embodiment of the present invention. In this design, the summed output frequency of the mixer 52 is filtered by a high side filter 58a and a low side filter 58b parallel thereto into respective upper ($F_{DRO}+F_{VCO}$) and lower ($F_{DRO}-F_{VCO}$) side bands. The upper side band is used to generate a final output frequency as the local oscillator output frequency, while the lower side band is used to form the coupled signal frequency and feed the phase locked loop circuit 66. A major advantage of this embodiment is that it provides a lower frequency for the phase locked loop circuit to divide in order to equal the reference clock frequency. The design eliminates the necessity for an external divider chip and allows direct use of the phase locked loop internal divider, which results in less complexity.

The dielectric resonator oscillator, the voltage controlled oscillator, the phase locked loop chips, and the reference crystal oscillator are assembled using standard surface mount methods. The "puck" is placed in its location defined by a trace on the board. A housing cover, without a tuning screw is placed over the dielectric resonator oscillator. On "turn-on," the microcontroller optimizes the gate bias for the dielectric resonator oscillator field effect transistor amplifier and writes the divide ratios for the phase locked loop chip. The phase locked loop input, which is a coupled portion of the local oscillator signal is then compared to the reference clock phase. The error signal is used to generate a voltage control signal that is used to compensate the voltage controlled oscillator output frequency.

This process is accomplished at initial "power-up" and on a continuous basis over the life of this frequency synthesizer forming the high frequency signal source of the present invention. As the dielectric resonator oscillator frequency drifts over time and temperature, the phase locked loop circuit senses this drift at the local oscillator output and corrects for it by adjusting the voltage controlled oscillator output. In addition to compensating for the dielectric resonator oscillator drift, the voltage controlled oscillator is used to provide some amount of local oscillator frequency tuning. Assuming that about 50 MHz of the voltage controlled oscillator tuning range is used for dielectric resonator oscillator compensation, there should at least be 100 MHz of available for tuning the local oscillator frequency range.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A high frequency signal source comprising:
   a dielectric, free running resonator oscillator having an output signal;
   a mixer that receives the output signal from the dielectric resonator oscillator; and
   a phase locked loop circuit having a voltage controlled oscillator with a predetermined tuning range and operatively connected to said mixer such that said mixer receives an output signal from the voltage controlled oscillator and sums the output frequencies from the dielectric resonator oscillator and voltage controlled oscillator for creating a summed output frequency, wherein a portion of the summed output frequency is fed as a coupled signal into the phase locked loop circuit that is phase locked to a reference signal to compensate for dielectric resonator oscillator frequency errors due to manufacturing and for any drift due to temperature changes or aging, wherein a higher output frequency accuracy with low phase noise is achieved without manual tuning and a portion of the tuning range of the voltage controlled oscillator compensates for any dielectric resonator oscillator initial frequency errors and drift over temperature and aging; and
   a filter operatively connected to the mixer for filtering the summed output frequency and eliminating unused side bands.

2. A high frequency signal source according to claim 1, and further comprising a crystal reference oscillator operatively connected to the phase locked loop circuit for providing a stable reference signal thereto.

3. A high frequency signal source according to claim 1, wherein said filter further comprises a high side filter for filtering an upper side band of the summed output frequency and provides a final output signal, and a low side filter operatively connected to the phase locked loop circuit for filtering a lower side band of the summed output frequency to provide a coupled signal to the phase locked loop circuit.

4. A high frequency signal source according to claim 1, and further comprising an amplifier operatively connected to said mixer for amplifying the summed output frequency.

5. A high frequency signal source according to claim 1, and further comprising a divider circuit positioned within said phase locked loop circuit for dividing the coupled signal by a factor "N".

6. A high frequency signal source according to claim 1, and further comprising a phase locked loop chip having registers that are programmed for dividing the coupled signal and reference signal by a divide ratio between "M" and "N", respectively.

7. A high frequency signal source according to claim 6, and further comprising a microcontroller operatively connected to said phase locked loop chip for programming the divide ratio between "M" and "N".

8. A high frequency signal source comprising:
a dielectric, free running resonator oscillator having a field effect transistor and an output signal;
a mixer that receives the output signal from the dielectric resonator oscillator;
a phase locked loop circuit having a phase locked loop chip and a voltage controlled oscillator with a predetermined tuning range and operatively connected to said mixer such that the mixer receives an output signal from the voltage controlled oscillator and sums the output signals for creating a summed output frequency, wherein a portion of the summed output frequency is fed as a coupled signal into the phase locked loop chip that is phase locked to a reference signal to compensate for dielectric resonator oscillator frequency errors due to manufacturing and for any drift due to temperature changes or aging, wherein a higher output frequency accuracy with low phase noise is achieved without manual tuning and a portion of the tuning range of the voltage controlled oscillator is used to compensate for any dielectric resonator oscillator initial frequency errors and drift over temperature and aging; and
a microcontroller operatively connected to said field effect transistor of the dielectric resonator oscillator and phase locked loop chip for determining a divide ratio between "M" and "N" for the coupled signal and reference signal respectively and adjusting gate bias on the field effect transistor.

9. A high frequency signal source according to claim 8, and further comprising crystal reference oscillator operatively connected to the phase locked loop chip for providing a stable reference signal thereto.

10. A high frequency signal source according to claim 8, and further comprising a filter operatively connected to the mixer for filtering the summed output frequency and eliminating unused side band signals.

11. A high frequency signal source according to claim 10, wherein said filter further comprises a high side filter for filtering an upper side band of the summed output frequency and providing a final output signal, and a low side filter operatively connected to the phase locked loop circuit for filtering a lower side band of the summed output frequency and providing a coupled signal to the phased lock loop chip.

12. A high frequency signal source according to claim 8, and further comprising an amplifier operatively connected to said mixer for amplifying the summed output frequency.

13. A high frequency signal source according to claim 8, and further comprising a divider circuit positioned within said phase locked loop circuit and connected to said phase locked loop chip for dividing the coupled signal by a factor "N".

14. A high frequency signal source according to claim 8, wherein said phase locked loop chip includes registers that are programmed for dividing the coupled signal and reference signal by a divide ratio between "M" and "N", respectively.

15. A method of generating a high frequency signal comprising the steps of:
mixing an output signal generated from a dielectric, free running resonator oscillator with an output signal from a voltage controlled oscillator having a predetermined tuning range and part of a phase locked loop circuit to sum the frequencies for creating a summed output frequency;
filtering the summed output frequency to aid in eliminating unused sidebands; and
coupling a portion of the summed output frequency as a coupled signal into the phase locked loop circuit that is phase locked to a reference signal to compensate for dielectric resonator oscillator frequency errors due to manufacturing and for any drift due to temperature changes or aging, wherein a higher output frequency accuracy with lower phase noise is achieved without manual tuning and a portion of the tuning range of the voltage controlled oscillator compensates for any dielectric resonator oscillator initial frequency errors and drift over temperature and aging.

16. A method according to claim 15, and further comprising the step of filtering the summed output frequency within a high side filter that filters the upper side band of the summed output frequency for providing a final output frequency and filtering the summed output frequency of the summed signal within a low side filter that filters the lower side band to provide a signal to the phased lock loop circuit.

17. A method according to claim 15, and further comprising the step of filtering within a bandpass filter.

18. A method according to claim 15, and further comprising the step of amplifying the signal before coupling.

19. A method according to claim 15, and further comprising the step of dividing the coupled signal by a factor "N".

20. A method according to claim 15, and further comprising the step of dividing the coupled signal within a divider circuit.

21. A method according to claim 15, and further comprising the step of dividing the coupled signal within registers contained within a phase locked loop circuit chip.

* * * * *

UNITED STATES PATENT AND TRADEMARK OFFICE
CERTIFICATE OF CORRECTION

PATENT NO. : 6,714,089 B2
DATED : March 30, 2004
INVENTOR(S) : Ammar et al.

It is certified that error appears in the above-identified patent and that said Letters Patent is hereby corrected as shown below:

Title page,
Item [75], Inventors, delete
"Inventors: Danny F. Ammar, Windermere, FL (US); Conrad Jordan, Tampa, FL (US)" substitute
-- Inventors: Danny F. Ammar, Windermere, FL (US); Conrad Jordan, Clermont, FL (US) --

Signed and Sealed this

First Day of March, 2005

JON W. DUDAS
*Director of the United States Patent and Trademark Office*